(12) United States Patent
Poechmueller

(10) Patent No.: US 6,847,571 B2
(45) Date of Patent: Jan. 25, 2005

(54) USE OF REDUNDANT MEMORY CELLS TO MANUFACTURE COST EFFICIENT DRAMS WITH REDUCED SELF REFRESH CURRENT CAPABILITY

(75) Inventor: Peter Poechmueller, Unterhaching (DE)

(73) Assignee: Infineon Technologies AG, Munich (DE)

( * ) Notice: Subject to any disclaimer, the term of this patent is extended or adjusted under 35 U.S.C. 154(b) by 32 days.

(21) Appl. No.: 10/406,320

(22) Filed: Apr. 4, 2003

(65) Prior Publication Data

US 2004/0196702 A1 Oct. 7, 2004

(51) Int. Cl.[7] ................................................ G11C 7/00
(52) U.S. Cl. ........................................ 365/222; 365/200
(58) Field of Search .................................. 365/222, 200

(56) References Cited

U.S. PATENT DOCUMENTS 6,366,516 B1 * 4/2002 Lippincott .................. 365/222
6,654,303 B2 * 11/2003 Miyamoto et al. .......... 365/222

* cited by examiner

*Primary Examiner*—Huan Hoang
(74) *Attorney, Agent, or Firm*—Morrison & Foerster LLP

(57) ABSTRACT

A redundant sense amplifier is provided together with a corresponding bit line, which is connected to all word lines in the memory array. This redundant bit line and corresponding redundant memory cells are used to store information which control the refresh of each word line on an individual basis. This way, only a memory cell which is being used needs to be refreshed, thereby saving power.

9 Claims, 2 Drawing Sheets

USE OF REDUNDANT MEMORY CELLS TO MANUFACTURE COST EFFICIENT DRAMS WITH REDUCED SELF REFRESH CURRENT CAPABILITY

BACKGROUND OF THE INVENTION

1. Field of the Invention

The present invention relates to the use of redundant memory cells to control self refresh activation in lower power DRAMs. More specifically, the present invention utilizes sense amplifiers attached to the redundant memory cells to determine whether an associated word line should be refreshed, thus saving power.

2. Description of the Related Art

DRAM is a volatile form of memory, which means that it must have power in order to retain data. With DRAM type memories, every couple of milliseconds the charge in the memory cells starts to disappear. This means DRAMs must be continuously and completely refreshed. Refresh is the process of recharging, or re-energizing, the cells in a memory chip. Cells are refreshed one row at a time (usually one row per refresh cycle).

FIG. 1 illustrates the standard sensing scheme of a low-power DRAM according to the prior art. First, a word line is activated, which is represented in FIG. 1 by the waveform WL. The waveform WL rises at this time. When the WL is completely up, the high word line causes the memory cells on that word line to be opened up. The memory cells then discharge on the corresponding bit line. After some time, the sense amplifiers are activated. After the sense amplifiers have sensed what is on the bit line, and the information has been read, it is amplified back into the memory cells. After this is done, the sense amplifier is switched off and the word line is driven back down. However, according to this arrangement, each word line must be refreshed continuously.

Continuously refreshing the memory cells consumes a lot of power, which is inconvenient in portable devices such as lap tops, PDAs, etc. This added power consumption speeds up the depletion of the remaining battery power in these devices.

Previously, various measures have been taken to attempt to reduce the stand-by power consumption resulting from the continuous refreshing operations. For example, architectural measures, such as attempting to shorten bit lines over the word lines in the memory array, are known in the art. However, this negatively affects the chip area because it requires additional sense amplifiers, which are comparatively large.

Another known method involves deactivating complete blocks of the memory so that unused blocks of memory do not need to be refreshed. However, the controller in this case must know which blocks are being used and which blocks are inactive and this is generally only done for very large blocks of memory.

SUMMARY OF THE INVENTION

According to an aspect of the invention, a redundant sense amplifier and bit line are placed (since it is realized as a normal bit line like all the others it could be placed anywhere in the array, not necessarily at the borderline) at the borderline of the memory array, where the redundant bit line stores information in the related memory cells to control refresh of each word line on an individual basis.

According to an aspect of the invention, a redundant sense amplifier may be connected to the memory array of the DRAM. A redundant bit line may be connected to the redundant sense amplifier and to word lines of the memory array, thereby forming redundant memory cells which store information for controlling whether corresponding word lines are to be refreshed.

According to another aspect of the invention, the information stored in the redundant memory cells may include information about whether the corresponding word lines are active. Further, the redundant memory cells may be read prior to reading the corresponding word lines. The word lines are preferably refreshed only if data stored in the corresponding redundant memory cells indicate that the corresponding word lines are active.

According to another aspect of the invention, control circuitry may be provided to automatically write a predetermined value into the redundant memory cells if a write operation is performed on the corresponding word lines. The predetermined value written into the redundant memory cells may enable refresh of the corresponding word lines.

According to a further aspect of the invention, a method of refreshing a memory which has redundant memory cells connected to respective word lines of the memory includes reading a signal level of the redundant memory cells and refreshing the word lines only if the corresponding redundant memory cells indicate that the respective word line is active.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE PREFERRED EMBODIMENTS

Figure 1:
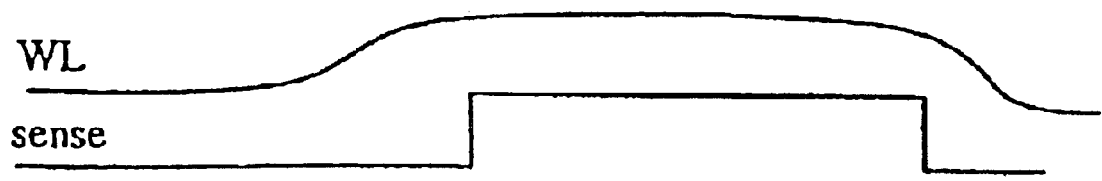
FIG. 1 is a diagram illustrating a typical sense scheme according to the prior art.

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

Figure 2:
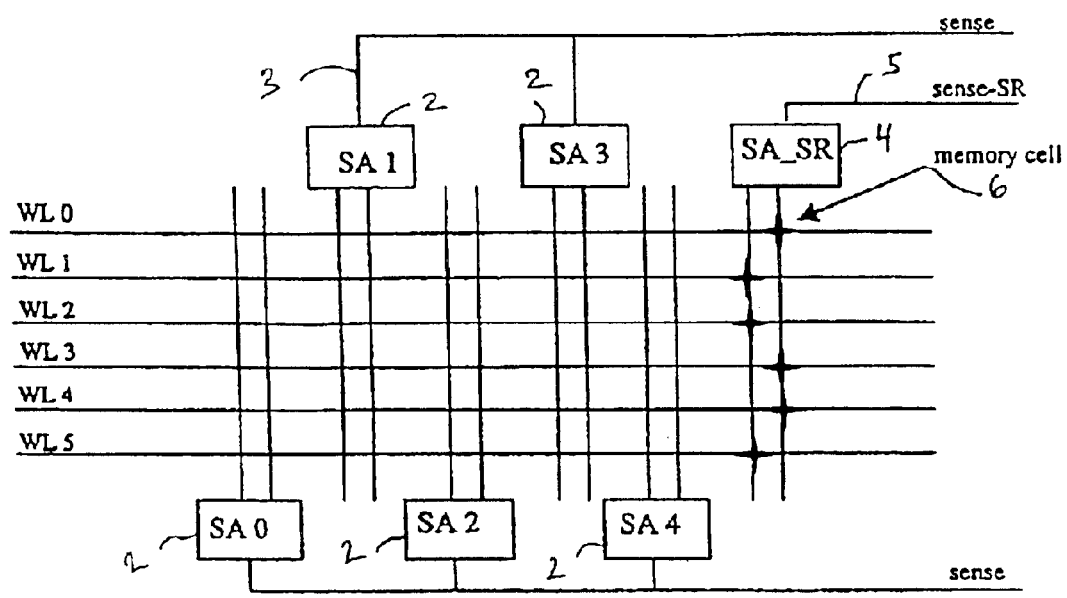
FIG. 2 is an illustration of a memory array according to the invention.

FIG. 2 shows a DRAM array having several word lines WL0–WL5 and corresponding bit lines 3 which run in parallel to the world lines in the figure. The bit lines 3 are connected to sense amplifiers 2 (SA0–SA4). It should be understood that a DRAM will have many more word lines and bit lines than are illustrated in FIG. 2. The configuration of word lines, bit lines and sense amplifiers is well known in the art.

In a normal refresh operation, the word line to be refreshed would be activated and, after some amount of time, the sense signal would initiate reading of all related memory cells through the corresponding sense amplifier.

This process restores all cell signals to their full levels. When a word line (WL) is activated, the sense signal goes high. This initiates the reading of the related memory cells. This is done until all memory cells are read, and thus refreshed.

According to the invention, a redundant sense amplifier 4 (SA_SR) is provided together with a corresponding bit line 5, which is connected to the word lines in the memory array. The redundant sense amplifier 4 can be any known sense amplifier such as the type used for sense amplifier(s) 2. This redundant bit line 5 and corresponding memory cells 6 are used to store information which control the refresh of each word line on an individual basis. This way, only a memory cell which is being used needs to be refreshed, thereby saving power.

Figure 3:
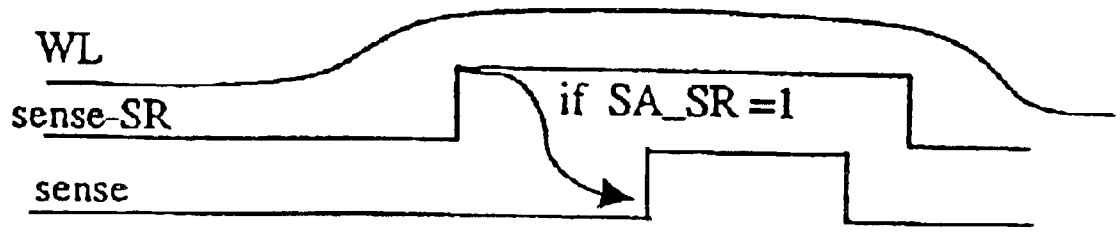
FIG. 3 is a diagram illustrating the sense scheme according to the invention.

Operation of the invention can be illustrated by way of example. For this example, we will assume that the next word line to be refreshed is WL0. The word line which corresponds to WL0 will be activated. In the prior art method, all related sense amplifiers (shown as SA0–SA4 in FIG. 1) would be activated. Instead, according to the preferred embodiment of the invention, the redundant sense amplifier 4 (SA_SR) is activated through the signal "sense-SR". This additional bit line stores information about the corresponding word line WL0. If word line WL0 has active data, the data in the memory cell will equal 1, or will be read as "high". This "high" state indicates that the word line WL0 needs to be refreshed. If the sense amplifier 4 (SA_SR) senses a "low" state, the controller (not shown) will understand that the word line WL0 is not active and does not need to be refreshed. A similar operation can be performed for each word line before the standard refresh operation is performed. If a memory cell in the redundant bit line shows that the corresponding word line is active, the corresponding sense amplifiers 2 will be read in parallel, thus refreshing that particular word line. This operation is illustrated in FIG. 3 and will be completed for all word lines.

Accordingly, the redundant bit line is read before any of the word lines are read. This is necessary because as soon as a word line is read, that word line will already have been refreshed and the power will have already been expended. However, if the redundant bit line is sensed before the word lines are read, power can be saved because only active word lines will need to be refreshed. Since most of the self refresh current is bit line charging current (about 80%), the current needed for self refresh operations can be dramatically reduced if word lines not currently being used by the application are disabled from the self refresh (are not refreshed). Thus, the redundant bit line and sense amplifier can save power. Further, the space needed to accommodate the redundant bit pair and sense amplifier are insignificant compared to the space used by the 2k–4k bit lines already connected to the physical word line circuit.

According to another aspect of the invention, additional circuitry could be provided which would automatically flag a self refresh data bit line bit if the application is writing into the associated word line. For example, a predetermined value could be written to a redundant memory cell which corresponds to the word line which is currently being written to. This predetermined value would be detected and would signal that the corresponding word line should not be refreshed. This would realize added advantages because the application would only be required to disable word lines from self refresh when previously valid data is to be disabled and therefore excluded from refresh.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A memory array comprising:

a redundant sense amplifier connected to the memory array; and a redundant bit line connected to the redundant sense amplifier and connected to word lines of the memory array, thereby forming redundant memory cells which store information for controlling whether corresponding word lines are to be refreshed.

2. The memory array as claimed in claim 1, wherein the information stored in the redundant memory cells includes information about whether the corresponding word lines are active.

3. The memory array as claimed in claim 1, wherein the redundant memory cells are read prior to reading the corresponding word lines.

4. The memory array as claimed in claim 3, wherein the word lines are refreshed if data stored in the corresponding redundant memory cells indicate that the corresponding word lines are active.

5. A method of refreshing a memory which has redundant memory cells connected to respective word lines of the memory, comprising:

reading a signal level of the redundant memory cells;

refreshing the word lines if the corresponding redundant memory cells indicate that the respective word line is active; and automatically writing a predetermined value into the redundant memory cells if a write operation is being performed on the corresponding word lines.

6. The method of claim 5, wherein each redundant memory cell is read before the corresponding word line is refreshed.

7. The method of claim 5, wherein each redundant memory cell is read at a time which is different from a time when memory cells of the corresponding word lines are refreshed.

8. The method of claim 5, wherein if the signal level of the redundant memory cell does not indicate that the corresponding word line is active, the corresponding word line will not be refreshed.

9. The method of claim 5, wherein the predetermined value written into the redundant memory cells disables refresh of the corresponding word lines.

* * * * *